United States Patent
Inaoka

(10) Patent No.: US 7,947,639 B2
(45) Date of Patent: May 24, 2011

(54) NON-AQUEOUS, NON-CORROSIVE MICROELECTRONIC CLEANING COMPOSITIONS CONTAINING POLYMERIC CORROSION INHIBITORS

(75) Inventor: Seiji Inaoka, Nazareth, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 542 days.

(21) Appl. No.: 11/719,690

(22) PCT Filed: Feb. 1, 2005

(86) PCT No.: PCT/US2005/002940
§ 371 (c)(1),
(2), (4) Date: May 18, 2007

(87) PCT Pub. No.: WO2006/065256
PCT Pub. Date: Jun. 22, 2006

(65) Prior Publication Data
US 2009/0156453 A1    Jun. 18, 2009

(51) Int. Cl.
*C11D 7/26* (2006.01)
*C11D 7/32* (2006.01)
*C11D 7/34* (2006.01)
*C11D 7/50* (2006.01)

(52) U.S. Cl. ........ 510/176; 510/245; 510/255; 510/264; 510/475; 510/493; 510/499; 510/500; 510/501; 510/505; 510/506

(58) Field of Classification Search ........... 510/175, 510/176, 245, 255, 264, 475, 493, 499, 500, 510/501, 505, 506
See application file for complete search history.

(56) References Cited

U.S. PATENT DOCUMENTS

| | | | |
|---|---|---|---|
| 5,561,105 A | 10/1996 | Honda | |
| 6,136,714 A | 10/2000 | Schutz | |
| 2001/0034313 A1* | 10/2001 | Honda et al. | 510/176 |
| 2002/0077259 A1* | 6/2002 | Skee | 510/175 |
| 2003/0004075 A1 | 1/2003 | Suto | |
| 2003/0130149 A1 | 7/2003 | Zhou et al. | |
| 2004/0048761 A1 | 3/2004 | Ikemoto | |

FOREIGN PATENT DOCUMENTS

| | | | |
|---|---|---|---|
| EP | 0 499 857 | | 8/1992 |
| JP | 60208752 | * | 10/1985 |
| JP | 60208752 A | | 10/1985 |
| JP | 63186243 | | 8/1988 |
| JP | 09034117 | * | 2/1997 |
| JP | 09034117 A | | 2/1997 |
| JP | 2001249465 | * | 9/2001 |
| JP | 2001249465 A | | 9/2001 |
| JP | 2003107754 | * | 4/2003 |
| JP | 2003107754 A | | 4/2003 |
| JP | 2004101849 | * | 4/2004 |
| JP | 2004101849 A | | 4/2004 |
| KR | 20020041834 | | 6/2002 |
| WO | WO 03/007085 | | 1/2003 |

* cited by examiner

*Primary Examiner* — Gregory R Del Cotto
(74) *Attorney, Agent, or Firm* — Ohlandt, Greeley, Ruggiero & Perle, LLP; George W. Rauchfuss, Jr.

(57) ABSTRACT

Photoresist strippers and cleaning compositions of this invention are provided by non-aqueous cleaning compositions that are essentially non-corrosive toward copper as well as aluminum and that comprise at least one polar organic solvent, at least one hydroxylated organic amine, and at least one corrosion inhibitor polymer having multiple hydroxyl- or amino-functional groups pendant from the polymer backbone.

12 Claims, No Drawings

NON-AQUEOUS, NON-CORROSIVE MICROELECTRONIC CLEANING COMPOSITIONS CONTAINING POLYMERIC CORROSION INHIBITORS

FIELD OF THE INVENTION

This invention relates to methods and non-aqueous, essentially non-corrosive, cleaning compositions for cleaning microelectronic substrates, and particularly to such cleaning compositions useful with and having improved compatibility with microelectronic substrates characterized by copper metallization as well as substrates characterized by aluminum metallization. The invention also relates to the use of such cleaning compositions for stripping photoresists, and cleaning residues from etch and plasma process generated organic, organometallic and inorganic compounds.

BACKGROUND TO THE INVENTION

Many photoresist strippers and residue removers have been proposed for use in the microelectronics field as downstream or back end of the manufacturing-line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etch gases or chemical etchant solutions selectively attack the photoresist-unprotected area of the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectonic device dimensions have decreased towards the size of atoms, the heat formed as current passes through the circuits has become a serious problem. It has become increasingly common in the art to employ copper metallizations as the conductor material, instead of aluminum, since copper is more beneficial in reducing the heat formation. These copper containing microelectronic materials have presented additional challenges to find acceptable cleaner compositions. Many process technology compositions that have been previously developed for "traditional" or "conventional" semiconductor devices containing Al/SiO$_2$ or Al (Cu)/SiO$_2$ structures cannot be employed with copper metallized structures. For example, hydroxylamine based stripper or residue remover compositions are successfully used for cleaning devices with Al metallizations, but are practically unsuitable for those with copper metallizations. Similarly, many copper metallized are not suitable for Al metallized devices unless significant adjustments in the compositions are made.

Removal of these etch and/or ash residues following the plasma etch and/or ashing process for such copper and aluminum metallized microelectronic structures has proved problematic, particularly for substrates metallized with copper. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

Heretofore, photoresist strippers have often contained amines since they generally show superior cleaning performance in attacking hardened photoresist and in the ability to strip such hardened photoresist from the surface of the microelectronic substrates. However, copper is generally also severely attacked by amines and significant metal corrosion can occur if such a conventional photoresist stripper is utilized without modification. Therefore, it is highly desirable to provide a copper compatible photoresist stripper or cleaner for use in the microelectronics industry, particularly for copper metallized materials. It is also highly desirable to provide a copper compatible photoresist stripper or cleaner for use in the microelectronics industry, particularly for copper metallized materials, that is also compatible for use with aluminum metallized materials. Since the same shift in technology from aluminum to copper metallization is being seen in the development of flat panel displays, it is also desirable to provide a stripper/cleaner that can be use in producing such flat panel displays.

BRIEF SUMMARY OF THE INVENTION

Back end photoresist strippers and cleaning compositions of this invention are provided by non-aqueous, non-corrosive cleaning compositions that are essentially non-corrosive toward copper as well as aluminum and that comprise at least one polar organic solvent, at least one hydroxylated organic amine, and at least one corrosion inhibitor that is a polymer having multiple functional amino or hydroxyl groups pendant from the polymer backbone. The compositions of this invention may also contain a number of other optional components. The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

The non-aqueous, essentially non-corrosive microelectronic stripper/cleaner compositions of this invention will generally comprise from about 80% or more of the organic polar solvent component, from about 1% to about 15% of the organic hydroxylated amine component, and a corrosion-inhibiting amount of the corrosion inhibitor polymer component, generally from about 0.1% to about 10% of the corrosion inhibitor polymer component with multiple hydroxyl functional groups. The wt percentages provided in this specification are based on the total weight of the cleaning composition.

The non-aqueous, essentially non-corrosive stripping/cleaning compositions of this invention can also optionally contain other compatible components, including but not limited to components such as chelating agents, organic hydroxyl-containing co-solvents, stabilizing and metal chelating or complexing agents, other metal corrosion inhibitors, and surfactants.

DETAILED DESCRIPTION OF INVENTION AND PREFERRED EMBODIMENTS

Back end photoresist strippers and cleaning compositions of this invention are provided by non-aqueous compositions that are essentially non-corrosive toward copper as well as aluminum and that comprise one or more polar organic solvents one or more organic hydroxylated amine, and one or more corrosion inhibitor polymers having multiple hydroxyl or amino groups pendant from the polymer backbone. By "non-aqueous" it is meant that the compositions are substantially free of water and will generally only have water present as impurities from the other components, and then will generally amount to no more than about 3% by weight of the composition, and preferably less.

The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride), can be readily cleaned with the cleaning compositions of this invention.

The non-aqueous, essentially non-corrosive microelectronic stripper/cleaner compositions of this invention will generally comprise from about 80% or more, preferably from about 85% or more, and most preferably from about 90% or more, of the organic polar solvent component; from about 1% to about 15%, preferably from about 2 to about 10%, and more preferably from about 2% to about 5%, of the organic hydroxylated amine component, and a corrosion-inhibiting amount of the corrosion inhibitor polymer component, generally from about 0.1% to about 10%, preferably from about 0.3% to about 5%, and more preferably from about 0.3% to about 3%. The wt percentages provided in this specification are based on the total weight of the cleaning composition.

The compositions of this invention can contain one or more of any suitable organic polar solvent, preferably organic polar solvents that includes amides, sulfones, sulfoxides, saturated alcohols and the like. Such organic polar solvents include, but are not limited to, organic polar solvents such as sulfolane (tetrahydrothiopene-1,1-dioxide), 3-methylsulfolane, n-propyl sulfone, dimethyl sulfoxide (DMSO), methyl sulfone, n-butyl sulfone, 3-methylsulfolane, amides such as 1-(2-hydroxyethyl)-2-pyrrolidone (HEP), dimethylpiperidone (DMPD), N-methyl-2-pyrrolidone (NMP), dimethylacetamide (DMAc), and dimethylformamide (DMF) and mixtures thereof. Especially preferred as the organic polar solvent are N-methylpyrrolidone, sulfolane, DMSO and mixtures of two or more of these three solvents.

The organic hydroxylated amine component may be one or more of any suitable hydroxylated amines, preferably hydroxylamine or an alkanolamine, preferably an alkanolamine. Suitable organic hydroxylated amine useful in the compositions of this invention include, but are not limited to hydroxylamine, monoethanolamine, diethanolamone, triethanolamine, and particularly 2-aminoethanol, 1-amino-2-propanol, 1-amino-3-propanol, 2-(2-aminoethoxy)ethanol, diethanolamine, 2-(2-aminoethylamino)ethanol, 2-(2-aminoethylamino)ethylamine and the like, and mixtures thereof. Most preferably the organic hydroxylated amine component is monoethanolamine, diethanolamine, triethanolamine, 2-(2-aminoethylamino)ethanol, and 1-amino-2-propanol and mixtures thereof.

The corrosion inhibiting compounds in the cleaning compositions of this invention are polymers having multiple pendant hydroxyl or amine groups pendant from the polymer backbone. Examples of suitable corrosion inhibitor polymers include, but are not limited to, polyethyleneimine polymers and copolymers, polyvinyl alcohol polymers and copolymers, polystyrene polymers and copolymers, poly (hydroxyl alkyl acrylate or methacrylate) polymers and copolymers, and the like. The polymers are preferably polyethyleneimine polymers, polyvinyl alcohol polymers, and polyvinyl alcohol-ethylene copolymers.

The compositions of this invention may also optionally contain one or more of any suitable organic hydroxyl- or polyhydroxyl-containing aliphatic compounds as a co-solvent. Any suitable organic hydroxyl-containing co-solvent may be employed in the compositions of this invention. Examples of such suitable organic hydroxyl-containing co-solvents include, but are not limited to, Examples of suitable corrosion inhibitors include, but are not limited to: arabitol, erythritol, xylitol, mannitol, sorbitol, ethylene dlycol, glycerol, 1,4-butane diol, 1,2-cyclopentanediol, 1,2-cyclohexanediol, and methylpentanediol, fructose, mono- and dialkyl ethers of diethylene glycol, known as Carbitol (2-(2-ethoxyethoxy)ethanol) and Carbitol derivatives, and saturated alcohols such as ethanol, propanol, butanol, hexanol, and hexafluoroisopropanol, and mixtures thereof. Especially preferred as a co-solvent is 2-(2-ethoxyethoxy)ethanol (Carbitol). A co-solvent may be present in the compositions of this invention in an amount, based on the total weight of the composition, of from 0 to about 10 wt %, preferably from about 0.1 to about 10 wt %, most preferably from about 0.5 to about 5 wt %, based on the weight of the composition.

The compositions of this invention may also contain one or more of any suitable other corrosion-inhibiting agents, preferably aryl compounds containing two or more OH, $OR_6$, and/or $SO_2R_6R_7$ groups bonded directly to the aromatic ring, where $R_6$, $R_7$ and $R_8$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in an amount of from 0 to about 10 wt %, preferably from about 0.1 to about 10 wt %, most preferably from about 0.5 to about 5 wt % based on the weight of the composition.

Organic or inorganic chelating or metal complexing agents are not required, but offer substantial benefits, such as for example, improved product stability. One or more of such inorganic chelating or metal complexing agents may be employed in the compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties e,g., ethylenediamine tetra(methylene phosphonic acid) (EDTMP), diethylenetriamine penta(methylene phosphonic acid), and triethylenetetramine hexa(methylene phosphonic acid), and mixtures thereof. The chelating agent will be present in the composition in an amount of from 0 to about 5 wt %, preferably from about 0.1 to about 2 wt %, based on the weight of the composition. Metal chelating or complexing agents of various phosphonates, such as ethylenediamine tetra(methylene phosphonic acid) (EDTMP) offer much improved stabilization of the cleaning compositions of the cleaning compositions of this invention containing oxidizing agents at acidic and alkaline conditions and thus are generally preferred.

Optional: other different metal corrosion inhibitors, such as benzotriazole; may be employed in an amount of from 0 to about 5 wt %, preferably from about 0.1 to 2 wt %, based on the weight of the composition.

The cleaning compositions optionally may also contain one or more suitable surfactants, such as for example dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in an amount of from 0 to about 5 wt %, preferably 0.1 to about 3 wt %, based on the weight of the composition.

Example of cleaning compositions of this invention include, but are not limited to, the compositions set forth in the following Table 1 and comparative compositions without the polymeric corrosion inhibitors are set forth in Table 2. In Tables 1 and 2 the abbreviations employed are as follows:
NMP=N-methyl pyrolidinone
SFL=sulfolane
DMSO=dimethyl sulfoxide
AMP=1-amino-2-propanol
DEA=diethanolamine
PEI=polyethyleneimine, anhydrous, high molecular weight-Aldrich 2003-2004 catalogue #40,872-7
PVA-E=poly(vinyl alcohol-co-ethylene), ethylene content 445-Aldrich 2003-2004 catalogue #41,407-7

TABLE 1

| Compositions/Parts by Weight | | |
|---|---|---|
| Components | 1 | 2 |
| NMP | 64.67 | 60 |
| SFL | 32.33 | 15 |
| DMSO |  | 15 |
| AMP | 2.7 |  |
| DEA |  | 5 |
| PEI | 0.3 |  |
| PVA-E |  | 1 |

TABLE 2

| Compositions/Parts by Weight | | |
|---|---|---|
| Components | A | B |
| NMP | 64.67 | 60 |
| SFL | 32.33 | 15 |
| DMSO |  | 15 |
| AMP | 3 |  |
| DEA |  | 5 |
| PEI |  |  |
| PVA-E |  |  |

The anti-corrosion results obtained with the corrosion inhibiting polymer-containing cleaning compositions of this invention were obtained in the following test for compositions of this invention A piece of copper-coated silicon wafer (approximately 20×20 mm) was prepared for the experiment. The piece was cleaned in a buffered oxide etch (which contains 35 w/w % NH4F and 6 w/w % HF for 1 minute, followed by rinsing in deionized water for 1 minute, and dried in nitrogen spray. Then the wafer piece was immersed in a 150 mL beaker that has 100 g of test solution in it, and the solution was heated at 60° C., stirred with a magnetic stirrer at 200 rpm and, 62 or 63 minutes later, the piece was removed from the test solution, rinsed with deionized water for 1 minute, and dried with nitrogen spray. The thickness of copper layer (before and after the experiment) was determined by the ResMap (manufactured by Creative Design Engineering, Sunnyvale, Calif.) 4-point probe system.

The test solutions (cleaning compositions) were the Invention Compositions 1 and 2 of Table 1 and the comparison compositions were Compositions A and B of Table 2. The comparison compositions were similar to compositions of the invention but not containing the corrosion inhibiting polymers of the invention.

TABLE 3

| Composition No. | Treatment time minutes | Cu Etch Rate (Å/min.) |
|---|---|---|
| 1 | 63 | 7.2 |
| A | 63 | 56.7 |
| 2 | 62 | 6.5 |
| B | 62 | 12.3 |

For the photoresist stripping, the same test compositions of this invention are used at the same temperature (60° C.) with the same stirring rate (200 rpm). A piece of glass having a positive photoresist layer (ca. 1000 angstroms) deposited thereon is immersed in the test solution to determine that photoresist is removed by the compositions of the invention.

In addition to the cleaning compositions of this invention being essentially non-corrosive to copper metallized microelectronic substrates and capable of cleaning photoresist, plasma and etch residues from such substrates, such compositions are also able to similarly clean aluminum metallized microelectonic substrates in a similar non-corrosive manner.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A non-aqueous cleaning composition for cleaning photoresist and residues from microelectronic substrates, said cleaning composition consisting essentially of:
   about 80% or more by weight of the composition of one or more polar organic solvents,
   about 1% to about 15% by weight of the composition of one or more alkanolamines,
   and 0.3% to about 10% by weight of the composition of a polymeric corrosion inhibitor, wherein the polymeric corrosion inhibitor is poly(vinyl alcohol-co-ethylene).

2. The cleaning composition of claim 1 wherein the polar organic solvent is selected from the group consisting of: sulfolane, 3-methylsulfolane, n-propyl sulfone, dimethyl sulfoxide, methyl sulfone, n-butyl sulfone, sulfolane, 3-methylsulfolane, 1-(2-hydroxyethyl)-2-pyrrolidone (HEP), dimethylpiperidone, N-methyl-2-pyrrolidone, dimethylacetamide and dimethylformamide.

3. The cleaning composition of claim 1 wherein the alkanolamine is selected from the group consisting of monoethanolamine, diethanolamine, triethanolamine, 2-aminoethanol, 1-amino-2-propanol, 1-amino-3-propanol, 2-(2-aminoethoxy)ethanol, 2-(2-aminoethylamino)ethanol, and 2-(2-aminoethylamino)ethylamine and mixtures thereof.

4. A cleaning composition of claim 3 wherein alkanolamine is selected from the group consisting of diethanolamine, and 1-amino-2-propanol.

5. A cleaning composition according to claim 1 wherein the organic polar solvent is selected from the group consisting of N-methylpyrrolidone, sulfolane, dimethyl sulfoxide and mixtures thereof, the alkanolamine is selected from the group consisting of diethanolamine, and 1-amino-2-propanol.

6. A cleaning composition according to claim 1 consisting essentially of N-methylpyrrolidone, sulfolane, dimethyl sulfoxide, diethanolamine and poly(vinyl alcohol-co-ethylene).

7. A process for cleaning photoresist or residue from a microelectronic substrate, the process comprising contacting the substrate with a cleaning composition for a time sufficient to clean the photoresist or residue from the substrate, wherein the cleaning composition consists essentially of
about 80% or more by weight of the composition of one or more polar organic solvents,
about 1% to about 15% by weight of the composition of one or more alkanolamines,
and 0.3% to about 10% by weight of the composition of a polymeric corrosion inhibitor, wherein the polymeric corrosion inhibitor is poly(vinyl alcohol-co-ethylene).

8. A process for cleaning photoresist or residue from a microelectronic substrate according to claim 7, wherein the alkanolamine is selected from the group consisting of hydroxylamine, monoethanolamine, diethanolamine, triethanolamine, 2-aminoethanol, 1-amino-2-propanol, 1-amino-3-propanol, 2-(2-aminoethoxy)ethanol, 2-(2-aminoethylamino)ethanol, and 2-(2-aminoethylamino)ethylamine and mixtures thereof.

9. A process for cleaning photoresist or residue from a microelectronic substrate according to claim 7, wherein the organic polar solvent is selected from the group consisting of N-methylpyrrolidone, sulfolane dimethyl sulfoxide and mixtures thereof, the alkanolamine is selected from the group consisting of diethanolamine, and 1-amino-2-propanol.

10. A process for cleaning photoresist or residue from a microelectronic substrate according to claim 7, wherein the cleaning composition consists essentially of N-methyl pyrrolidone, sulfolane, dimethyl sulfoxide, diethanolamine and poly(vinyl alcohol-co-ethylene).

11. A process for cleaning photoresist or residue from a microelectronic according to claim 7, wherein the cleaning composition consists essentially of N-methyl pyrrolidone, sulfolane, dimethyl sulfoxide, 1-amino-2-propanol and poly(vinyl alcohol-co-ethylene).

12. A process according to claim 7 wherein the microelectronic substrate to be cleaned is characterized by the presence of copper metallization.

\* \* \* \* \*